United States Patent
Hiltner et al.

(10) Patent No.: US 12,032,419 B2
(45) Date of Patent: Jul. 9, 2024

(54) THERMAL MANAGEMENT SYSTEMS FOR ELECTRONIC DEVICES AND RELATED METHODS

(71) Applicant: Intel Corporation, Santa Clara, CA (US)

(72) Inventors: Matthew E. Hiltner, Hillsboro, OR (US); Sumeet R. Pawnikar, Bangalore (IN); Evrim Binboga, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 684 days.

(21) Appl. No.: 17/132,838

(22) Filed: Dec. 23, 2020

(65) Prior Publication Data

US 2021/0149465 A1    May 20, 2021

(51) Int. Cl.
| | |
|---|---|
| *G06F 1/20* | (2006.01) |
| *H05K 7/20* | (2006.01) |
| *G05B 19/042* | (2006.01) |
| *G06N 5/04* | (2023.01) |
| *G06N 20/00* | (2019.01) |

(52) U.S. Cl.
CPC ........ *G06F 1/206* (2013.01); *H05K 7/20209* (2013.01); *G05B 19/042* (2013.01); *G05B 2219/21156* (2013.01); *G06F 1/203* (2013.01); *G06N 5/04* (2013.01); *G06N 20/00* (2019.01)

(58) Field of Classification Search
CPC ........ G05B 19/042; G05B 2219/21156; G05B 19/0426; G05B 23/0235; G05B 23/0291; G06F 1/203; G06F 1/206; G06F 1/26; G06N 20/00; G06N 3/08; G06N 5/04
USPC .......................................................... 700/300
See application file for complete search history.

(56) References Cited

U.S. PATENT DOCUMENTS

| | | | |
|---|---|---|---|
| 6,591,198 B1 * | 7/2003 | Pratt | G10K 15/04 702/56 |
| 7,974,743 B2 * | 7/2011 | Nakashima | G06F 1/206 713/323 |
| 9,183,845 B1 * | 11/2015 | Gopalakrishnan | G10L 21/0208 |
| 2004/0120113 A1 * | 6/2004 | Rapaich | G06F 1/203 361/679.46 |
| 2005/0094823 A1 * | 5/2005 | Kobori | G10K 11/17823 381/71.5 |
| 2009/0092261 A1 * | 4/2009 | Bard | G06F 1/3203 381/71.1 |

(Continued)

*Primary Examiner* — Chun Cao
(74) *Attorney, Agent, or Firm* — Hanley, Flight & Zimmerman, LLC (57) ABSTRACT

Methods, apparatus, systems, and articles of manufacture are disclosed. An example electronic device disclosed herein includes a microphone and a thermal management system having a fan. The electronic device includes a processor to detect ambient noise via the microphone, identify a sound of interest value associated with the ambient noise and identify a background noise value associated with the ambient noise. The processor to determines a signal-to-noise ratio based on the sound of interest value and the background noise value and compares the signal-to-noise ratio to a sensitivity threshold. In response to determining that the signal-to-noise ratio exceeds the sensitivity threshold, the processor operates the thermal management system with one or more restrictions.

20 Claims, 4 Drawing Sheets (56) References Cited

U.S. PATENT DOCUMENTS

| | | | |
|---|---|---|---|
| 2009/0092262 A1* | 4/2009 | Costa | G10K 11/16 381/71.1 |
| 2014/0094973 A1* | 4/2014 | Giaimo, III | F04D 27/004 381/56 |
| 2016/0013745 A1* | 1/2016 | North | H02P 7/2913 318/460 |
| 2021/0092517 A1* | 3/2021 | Kulkarni | H04R 1/326 |

* cited by examiner

THERMAL MANAGEMENT SYSTEMS FOR ELECTRONIC DEVICES AND RELATED METHODS

FIELD OF THE DISCLOSURE

This disclosure relates generally to electronic user devices and, more particularly, to thermal management systems for electronic devices and related methods.

BACKGROUND

During operation of an electronic user device (e.g., a laptop, a tablet), hardware components of the device, such as a processor, a graphics card, and/or battery, generate heat. To cool electronic devices during use and prevent overheating of hardware components, electronic user devices include one or more fans for active cooling.

In general, the same reference numbers will be used throughout the drawing(s) and accompanying written description to refer to the same or like parts. As used herein "substantially real time" refers to occurrence in a near instantaneous manner recognizing there may be real world delays for computing time, transmission, etc. Thus, unless otherwise specified, "substantially real time" refers to real time +/−1 second.

DETAILED DESCRIPTION

During operation of an electronic device (e.g., a laptop, a tablet, etc.), hardware components disposed in a body or housing of the device, such as a processor, graphics card, and/or battery, generate heat. Heat generated by the hardware components of the electronic device can cause a temperature of one or more electronic components to exceed maximum operating temperature limits of the one or more electronic components and/or cause a temperature of a skin enclosure to approach and/or exceed a desired maximum allowable temperature. To prevent overheating of the hardware components and/or skin enclosure temperatures from exceeding a desired threshold, electronic devices include thermal management systems to dissipate heat from the electronic devices. Example thermal management systems include passive cooling systems and/or active cooling systems.

Passive cooling systems employ natural convection and heat dissipation by utilizing heat spreaders or heat sinks to increase (e.g., maximize) radiation and convection heat transfer. For instance, passive cooling systems do not employ external devices such as fans or blowers that would otherwise force airflow to exhaust heat from the housing of the electronic device. Instead, passive cooling systems rely on material characteristic(s) to provide heat transfer pathways between electronic components and outer surfaces or skins of the electronic devices. Additionally, or alternatively, passive cooling can be implemented by a throttling policy of an electronic device. For instance, to cool one or more electronic components using passive cooling throttling, power to one or more electronic components can be reduced and/or throttled to cool the hardware components and/or skin enclosure.

Passive cooling systems are significantly less expensive than active cooling systems, do not require power to operate, and provide space saving benefits. Additionally, passive cooling systems do not generate noise during operation. However, passive cooling systems may not often handle heat dissipation requirements during certain operations performed by electronic devices (e.g., high speed computing). Thus, although passive cooling systems are relatively quiet during operation, passive cooling systems may not meet the needed cooling requirements of certain processors. For instance, some known user devices can operate in a high performance mode, or a mode that favors increased processing speeds over energy conservation (e.g., a mode in which processing speeds remain high for the duration that the device is in use, the screen remains brightly lit, and other hardware components do not enter power-saving mode when those components are not in use). The processor consumes increased power to accommodate the increased processing speeds associated with the high performance mode and, thus, the amount of heat generated by the processor is increased. For instance, passive cooling systems are often employed with processors that do not exceed approximately 10 watts of power. Processors that exceed 10 watts of power often require active cooling systems to effectively cool these processors below desired operating temperatures, skin enclosure maximum temperatures and/or any other desired temperature(s).

Active cooling systems employ forced convention methods to increase a rate of fluid flow, which increases a rate of heat removal. For example, to exhaust heat or hot air generated within the body of the electronic device and cool the electronic device, active cooling systems often employ external devices such as fans or blowers, forced liquid, thermoelectric coolers, etc. In known electronic devices, operation of the fan(s) of the electronic device and/or management of power consumed by the device are controlled based on the thermal constraint(s). For instance, if a temperature of a hardware component of the device is approaching a maximum operating temperature as defined by the thermal constraint for the component and/or a skin enclosure temperature is approaching or exceeding a desired temperature, rotational speed(s) (e.g., revolutions per minute (RPM(s))) of the fan(s) can be increased to exhaust hot air and reduce a temperature of the component and/or the skin enclosure. Higher fan speeds can be used to facilitate cooling of hardware component(s) of a device to enable the component(s) to operate in, for instance, a high performance mode without exceeding the thermal constraint(s) for the hardware competent(s), desired skin enclosure temperatures and/or any other desired temperature.

However, operation of the fan(s) at higher speeds increases audible acoustic noise generated by the fan(s). Thus, in some known user devices, the fan speed(s) and, thus, the amount of cooling that is provided by the fan(s), can be restricted to avoid generating fan noise levels over certain decibels. Some known devices define fan noise constraints that set, for instance, a maximum noise level of 35 dBA during operation of the fan(s). As a result of the restricted fan speed(s), performance of the device may be limited to enable the fan(s) to cool the user device within the constraints of the fan speed(s). In some examples, a desirable SNR (signal-to-noise ratio) can be maintained by boosting/adapting a volume of an electronic device to a desired sound (signal) if the fan generates too much noise.

Additionally, or alternatively, power consumption by one or more components of the device (e.g., the graphics card) may be reduced to decrease an amount of heat generated by the component and, thus, the device. Thus, although electronic devices employ active cooling systems, some electronic devices restrict activation of the fan in favor of reducing an amount of power to electronic components. For example, fan speed and, thus, the amount of cooling that is provided by the fan(s), can be restricted to avoid generating fan noise levels over certain decibels (e.g., a maximum noise level of 35 dBA during operation of the fan(s)). As a result of the restricted fan speed(s), performance of the device may be limited to enable the fan(s) to cool the user device within the constraints of the fan speed(s). Thus, in some known devices, processing performance is sacrificed in view of thermal constraint(s).

Although some thermal management systems restrict operation of fans at speeds that do not generate more than 35 dBA during operation, known electronic devices do not control noise generated by the fans based on one or more detected environment and/or surrounding conditions. Thus, active (fan/cooling) thermal policies scale fan speed with computational demand without regard to environment. In other words, current active thermal policy systems do not account for background noise (e.g., to keep a constant SNR (signal-to-noise ratio)). Without regard to a sensitivity of a situation to noise, current solutions scale fan speed with temperature/computational demand. As a result, if an electronic device determines to install updates during an important meeting, the electronic device may generate noise if a fan operates, to cool hardware components of the electronic device, which can be awkward or distracting.

For example, it may be undesirable for a fan of an electronic device (e.g., a desktop, a laptop, a mobile device, a tablet, etc.) to operate loudly during a conversation, playing of music or videos, or during other noise-sensitive circumstance(s). For instance, during a conference (e.g., held in a conference room), a lecture or other noise-sensitive events, activation of fan of an electric device to cool the device can be distracting to a user of the electronic device or others in the vicinity of the device when the fan is whirring loudly. In some instances, it may be distracting during a videoconference for a fan of an electronic device to drown out a participant's voice.

In some instances, for example, electronic devices are often located in a noisy environment (e.g., a coffee shop, a train station). Additionally, or alternatively, in some instances, the user may be interacting with the user device while wearing headphones. In such known electronic devices, the rotational speed of the fan(s) is maintained at a level that minimizes noise from the fan(s) regardless of the surrounding ambient noise levels and/or whether or not the user is wearing headphones.

Activating thermal policy of electronic devices regardless of the surrounding ambient conditions, the electronic device may generate maximum noise from the fan(s) during times when an environment in which the electronic device is present is sensitive to noise and may generate minimum noise from the fan(s) during times when an environment in which the electronic device is present is not sensitive to noise.

Disclosed herein are example user devices that provide for dynamic adjustment of thermal constraints and/or fan acoustic noise levels of the user device. Example electronic devices disclosed herein use a thermal management system to control operation of fan(s) of the device and/or to adjust a performance level of the device and, thus, control heat generated by hardware component(s) of the device based on ambient noise levels in an environment in which the device is located. Example user devices disclosed herein include sensors to detect conditions in the ambient environment in which the device is located (e.g., ambient noise sensor(s)). Based on the detected environment conditions determined via the sensor data, example electronic devices disclosed herein selectively control an amount of power provided to hardware component(s) and/or fan speed level(s) (e.g., RPM(s)) based on a selected thermal constraint (e.g., a default thermal constraint or a user selected thermal constraint). In some examples disclosed herein, rotational speed(s) (e.g., RPM(s)) of the fan(s) of the user device are increased when sensor data from the ambient noise sensor(s) indicates that the user is in a loud environment. In such examples, because the user device is located in a noisy environment, the resulting increase in fan acoustics from the increased rotational speed(s) of the fan(s) is offset by the ambient noise. Rather than maintaining the thermal constraint(s) of the device and/or the fan noise constraint(s) at respective default levels during operation of the device, examples disclosed herein dynamically adjust the constraints and, thus, the performance of the device, based on user and/or environmental factors. As a result, performance of the device can be selectively increased in view of the opportunities for increased audible fan noise levels in response to ambient noise levels. Thus, in certain conditions that can benefit from a reduction of noise from an operation of a fan, example electronic devices disclosed herein reduce fan speed and/or restrict fan operation in favor of employing passive cooling protocols that include power reduction protocols to reduce heat.

To detect or determine ambient environment conditions, example electronic devices disclosed herein monitor and/or detect (e.g., filter) sounds of interest from background noise. To detect or differentiate sounds of interest from background noise, example electronic devices disclosed herein monitor and/or maintain a signal-to-noise ratio (SNR) to a desired level. To maintain a noise portion of the SNR to a desired level (e.g., under control), example electronic devices disclosed herein compare the SNR value to a sensitivity threshold. The sensitivity threshold can be a user selectable sensitivity and/or can be a default sensitivity setting configured at the factory. In response to the SNR signal exceeding the sensitivity threshold, example electronic devices disclosed herein manage a noise component of the SNR by reducing an allowable fan speed. As a secondary effect, in some examples, capping a fan speed can influence thermal policy (Dynamic Tuning Technology (DTT)) to also limit a core performance of a processor (which has the effect of cooling the system).

Thus, instead of modifying a volume of a user audio system to maintain consistent user experience (as in some known electronic devices), example electronic devices disclosed herein maintain a consistent user experience by identifying and/or maintaining a noise portion of a SNR under control. Additionally, instead of basing calculations entirely on environmental sound, the example systems disclosed herein can employ a digital system processor and heuristic to separate sounds of interest (signal) from background noise, including fan/cooling.

Some example systems disclosed herein provide a percentage preference factor for active cooling versus passive cooling. In some examples, a preference factor can be set to default to 100% (entirely active cooling policy). The percentage preference can be applied to pre-existing DTT (Dynamic Tuning Technology) active and/or passive cooling policies or can be directly used to inform SoC voltage/frequency scaling. Example systems disclosed herein can detect a situational signal-to-noise ratio/sensitivity threshold that may be unacceptable or undesirable to have excessive fan noise and the example system can prevent activation of an active cooling system (e.g., a fan). For example, in response to detecting a change of temperature of one or more electronic components and/or a skin enclosure, example systems disclosed herein can determine if added active/fan cooling would exceed a user-specified noise ratio (e.g., a SNR sensitivity threshold). If so, the system can be configured to favor passive cooling (e.g., thermal throttling) instead of active cooling (e.g., increased fan speed) by decreasing active preference factor.

Additionally, example systems disclosed herein can dynamically implement or change between active cooling (e.g., fan use) and passive cooling (e.g., throttling) based on a change of environmental noise. For example, example systems disclosed herein can be configured to re-allocate a cooling preference to active or passive, by adjusting the preference factor appropriately. For instance, example systems disclosed herein can determine a change in an environment noise level (e.g., from quiet noise to loud noise, and vice versa). For example, example systems disclosed herein can determine when the electronic device enters a louder environment sufficient to mask active cooling and/or can determine that there is no signal (sound of interest) to protect. In contrast, example systems disclosed herein can be configured to detect when the electronic device enters and/or is positioned in a quieter environment and/or detects a signal (e.g., a new detected sound of interest) to protect, etc.

Figure 1:
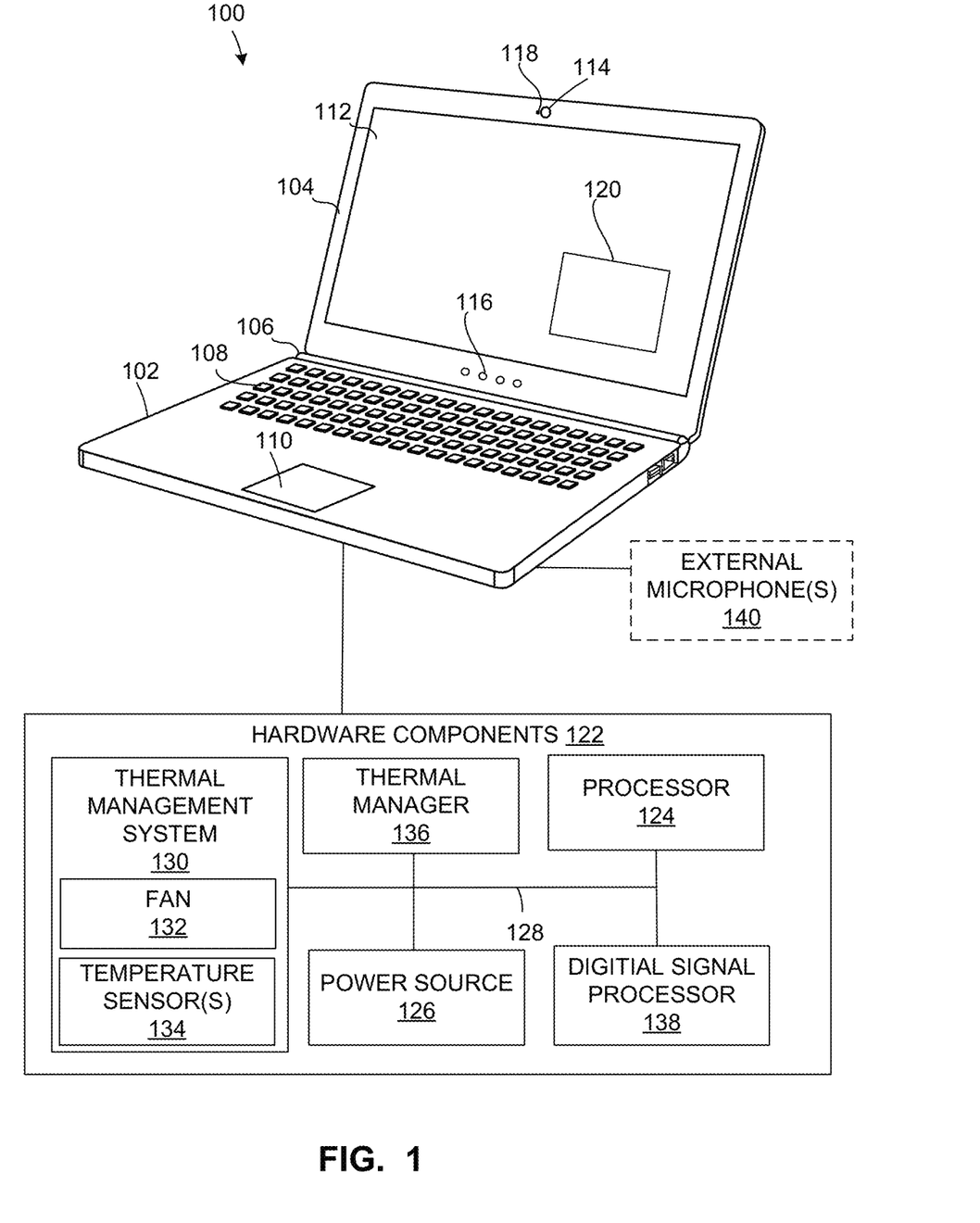
FIG. 1 is an example electronic device constructed in accordance with teachings of this disclosure.

FIG. 1 is an example electronic device 100 constructed in accordance with teachings of this disclosure. The electronic device 100 of the illustrated example is a mobile device (e.g., a laptop, etc.). Although the example electronic device 100 of the illustrated example is a laptop, in some examples, the electronic device 100 can be a tablet, a desktop, a mobile device, a cell phone, a smart phone, a hybrid or convertible PC, a personal computing (PC) device, a sever, a modular computing device, a digital picture frame, a graphic calculator, a smart watch, and/or any other electronic device that employs active cooling.

The electronic device 100 of the illustrated example includes a first housing 102 coupled to a second housing 104 via a hinge 106. The hinge 106 enables the second housing 104 to rotate or fold relative to first housing 102 between a stored position (e.g., where the second housing 104 is aligned or parallel with the first housing 102) and an open position as shown in FIG. 1 (e.g., where the second housing 104 is non-parallel relative to the first housing 102). In the open position, the second housing 104 can rotate relative to the first housing 102 about the hinge 106 to a desired viewing angle. To enable user inputs, the first housing 102 of the illustrated example includes a keyboard 108 and a track pad 110. The second housing 104 carries a display 112, a camera 114, a speaker 116 and a microphone 118. In some examples, the display 112 can be a touch-screen that enables user inputs. Additionally, the display 112 of the illustrated example presents a graphic user interface (GUI) 120 to enable a user to interact with the electronic device 100 (e.g., to select and/or adjust setting of the electronic device 100 via the keyboard 108, the track pad 110 and/or touch feature of the display 112).

The first housing 102 encloses hardware components 122 of the electronic device 100. The hardware components 122 of the illustrated example include a processor 124 (e.g., a central processing unit coupled to a circuit board) that executes software to interpret and output response(s) based on the user input event(s) (e.g., touch event(s), keyboard input(s), etc.). The electronic device 100 of FIG. 1 includes one or more power sources 126 such as a battery to provide power to the processor 124 and/or other components of the electronic device 100 communicatively coupled via a bus 128. The hardware components 122 of the illustrated example can also include a video graphics card, light emitting diodes, memory, a storage drive, antenna(s), and/or any other hardware and/or electronic components for implementing the electronic device 100.

The hardware components 122 of the electronic device 100 (e.g., the processor 124, a video graphics card, etc.) generate heat during operation of the electronic device 100. To dissipate or spread heat generated by the hardware components 122 during operation of the electronic device 100, the electronic device 100 of the illustrated example employs a thermal management system 130. The thermal management system 130 of the illustrated example is an active cooling system that includes a fan 132 (e.g., one or more fans). The thermal management system 130 of the illustrated example includes temperature sensor(s) 134 to measure temperature(s) associated with the hardware components 122 of the electronic device 100, skin enclosure, and/or other component(s). In some examples, the electronic device 100 can receive external components, such as, for example, an external microphone(s) 140, headphones, etc.

In the example of FIG. 1, operation of the fan 132 is controlled by a thermal manager 136 in view of one or more thermal constraints for the electronic device 100 that define temperature settings for the hardware components 122 of the electronic device 100. For example, the thermal manager 136 of the illustrated example processes temperature data generated by the temperature sensor(s) 134 for one or more of the hardware components 122 and operates the fan 132 to reduce a temperature of the one or more hardware components 122 in response to detecting that a temperature of the one or more hardware components 122 is approaching a maximum desired operating temperature. The fan 132 provides means for cooling and/or regulating a temperature of the hardware components 122 (e.g., the processor 124) of the electronic device 100 in response to temperature data generated by the temperature sensor(s) 134. In some instances, the thermal manager 136 can be configured to operate the fan 132 to reduce a temperature of a skin enclosure.

Additionally, the thermal manager 136 of the illustrated example can modify (e.g., restrict and/or prevent) operation of the fan 132 based on detected ambient noise conditions of an environment in which the electronic device 100 is located and/or being used. To detect ambient noise conditions of an environment in which the electronic device 100 is located and/or being used, the electronic device 100 of the illustrated example includes a digital signal processor 138 (DSP). For example, the digital signal processor 138 of the illustrated example serves to process sensor data generated by the microphone 118 to detect ambient noise conditions or levels of an environment. The thermal manager 136 uses the detected ambient noise conditions to determine if operating the fan 132 at a given instance in time and/or specific fan speed would reduce a signal-to-noise ratio of ambient noise conditions to unacceptable levels (e.g., a ratio between fan noise to environmental sound). In some examples, a sensitivity of a signal-to-noise ratio can be selected or adjusted by a user via the graphic user interface 120 presented by the display 112.

Thus, the thermal manager 136 of FIG. 1 evaluates ambient noise conditions to determine if fan noise levels can be increased or should be decreased to maintain a signal-to-noise ratio of ambient noise conditions within acceptable levels. Thus, the example thermal manager 136 of the illustrated example determines to either actively cool the hardware components 122 via active cooling (e.g., via the fan 132) or passively cool by scaling voltage/frequency in response to the processor 124 (e.g., SoC) exceeding a desired or threshold operating temperature (e.g., is too warm) detected by the thermal manager 136. Additionally, the ambient noise conditions detected by the digital signal processor 138 enables the thermal manager 136 to employ fan acoustic constraints (e.g., override active cooling) to affect operation (e.g., a rotational speed(s)) of the fan 132 and, thus, noise generated by the fan 132 based on ambient noise conditions in which the electronic device 100 is located and/or being used.

In some examples, the thermal manager 136 dynamically adjusts the thermal constraint(s) and/or fan acoustic constraint(s) based on temperature data generated by the temperature sensor(s) 134. For example, if data from the temperature sensor(s) 134 indicates that a housing or skin temperature is approaching a temperature threshold defined by a selected thermal constraint or a preset temperature threshold, the thermal manager 136 generates instructions to maintain or reduce the skin temperature by adjusting power consumption of the hardware components 122 and/or by operation of the fan 132.

Figure 2:
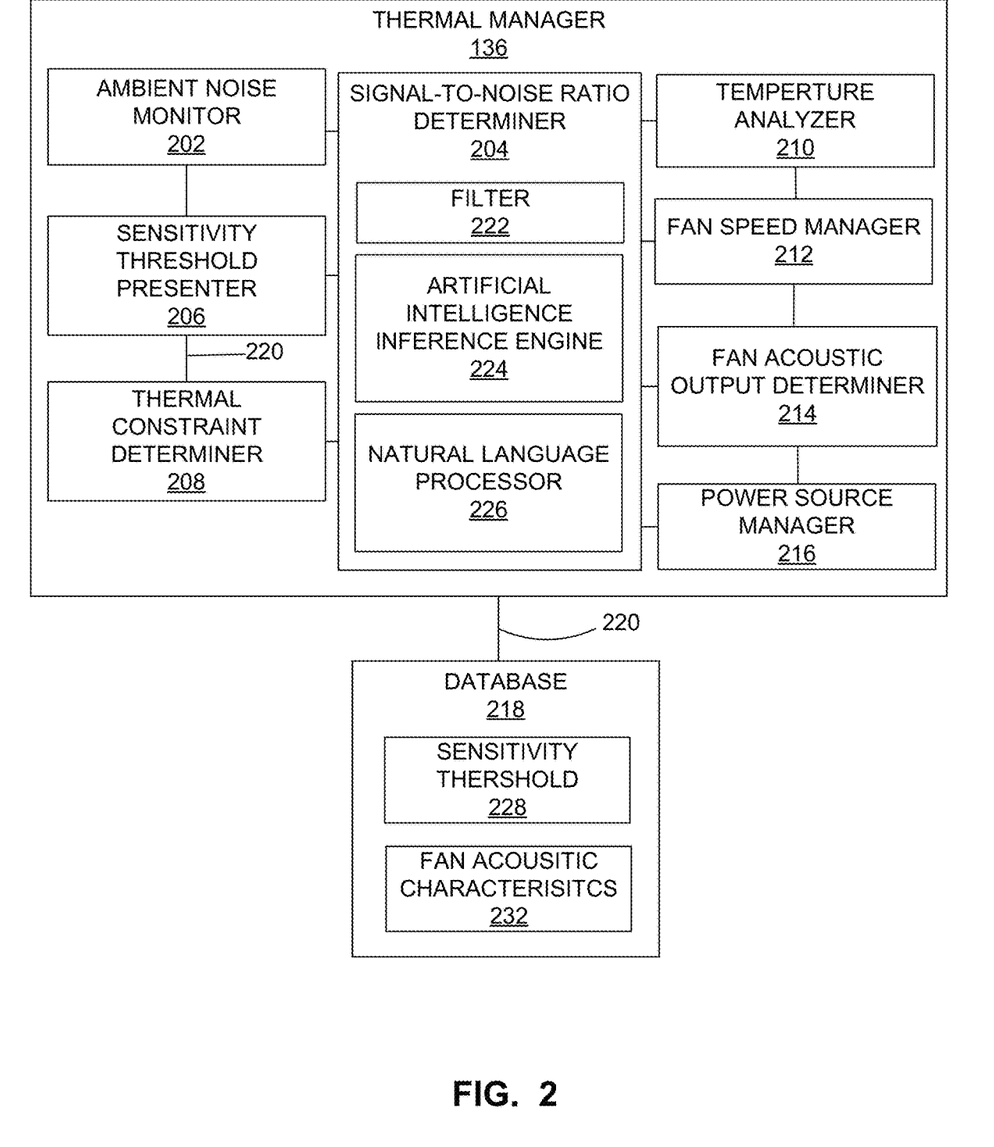
FIG. 2 is a block diagram of an example implementation of an example thermal manager of FIG. 1.

FIG. 2 is a block diagram of an example implementation of the thermal manager 136 of FIG. 1. As mentioned above, the thermal manager 136 is constructed to detect ambient noise condition(s) relative to the electronic device 100 and to generate instructions that cause the electronic device 100 to transition between one or more thermal constraints with respect to one or more fan acoustic constraints with respect to audible noise generated by the fan 132 of the electronic device 100. In the example of FIG. 2, the thermal manager 136 is implemented by the processor 124, the digital signal processor 138 and/or other processors and/or hardware components 122 of the electronic device 100. In some examples, the thermal manager 136 is implemented by the processor 124 (e.g., a system of on chip (SoC)).

The thermal manager 136 of the illustrated example includes an example ambient noise monitor 202, a signal-to-noise ratio (SNR) determiner 204, an example sensitivity threshold presenter 206, an example thermal constraint determiner 208, an example temperature analyzer 210, an example fan speed manager 212, an example fan acoustic output determiner 214, a power source manager 216, and example database 218 that are communicatively coupled via a bus 220. The SNR determiner 204 of the illustrated example includes an example filter 222, an example artificial intelligence (AI) interference engine 224, and a natural language processor (NLP) 226. The example database 218 of the illustrated example includes a sensitivity threshold 228 and example fan acoustic characteristics 230.

To monitor ambient noise conditions, the thermal manager 136 of the illustrated example includes the ambient noise monitor 202. In this example, the ambient noise monitor 202 provides means for monitoring signal data captured by the microphone 118. For example, the ambient noise monitor 202 of the illustrated example employs or leverages low power, always listening (LPAL) signal processing functionality (e.g., of the digital signal processor 138 (DSP)) of the electronic device 100 to (e.g., continuously) detect and/or observe ambient noise conditions and/or fan noise in an environment in which the electronic device 100 is located.

For example, the ambient noise monitor 202 can employ primary and/or internal audio input sources of the electronic device 100 to receive the signal data (e.g., sound waveform(s)) representative of the ambient noise conditions of an environment in which the electronic device 100 is located and provides the signal data to the SNR determiner 204 for classifying the ambient noise and determine (e.g., calculate) the signal-to-noise ratio. In some examples, the electronic device 100 of the illustrated example can use auxiliary, secondary and/or external audio input sources to provide the signal data to the ambient noise monitor 202 and/or the SNR determiner 204. For example, the ambient noise monitor 202 of the illustrated example receives signal data from the microphone 118 (e.g., built-in microphones, internal microphones, etc.) and/or the external microphone 140. In some examples, the thermal manager 136 and/or the SNR determiner 204 (e.g., the digital signal processor 138) receives sensor data from the microphone 118 in substantially real-time (e.g., near the time the data is collected).

To improve the signal data characteristics, in some examples, the ambient noise monitor 202 can perform one or more pre-analysis operations of the sensor data prior to communicating the signal data to the SNR determiner 204. For example, pre-analysis operations can include, for example, acoustic correction(s) (e.g., pre-filtering a raw signal data, removing noise from the signal data (e.g., acoustic cleanup)), converting the signal data from analog data to digital data (e.g., via an analog-to-data converter), signal data cleanup, and/or any other pre-processing analysis to improve accuracy of the signal data prior to providing the signal data to the SNR determiner 204. For example, the electronic device 100 (e.g., the microphone 118, etc.) can include a noise cancellation functionality (e.g., built into the microphone 118) prior to providing the signal data to the digital signal processor 138 (FIG. 1). If the noise cancellation functionality exposes noise cancellation, a calculated noise power value can be used by the SNR determiner 204 to estimate ambient noise when this calculation is otherwise unavailable or impractical in low-power situations. In this case, however, not all ambient noises are caused by the electronic device 100 (e.g., in question), so some post processing may still be needed.

To identify ambient noise conditions representative of the signal data provided by the ambient noise monitor 202, the thermal manager 136 of the illustrated example includes the SNR determiner 204. The SNR determiner 204 of the illustrated example analyzes the signal data from the ambient noise monitor 202 (e.g., raw data and/or pre-processed data) to detect or identify sounds of interest (e.g., signals) and/or background noise. The example ambient noise monitor 202 and/or the SNR determiner 204 can receive signal data (e.g., sound waves) at any desired sampling rate (e.g., 96 kilohertz (kHz) samples at a 24-bit audio bit depth). For example, the SNR determiner 204 of the illustrated example (e.g., continuously) observes ambient noise using a LPAL (low power, always listening) functionality of the digital signal processor 138 of FIG. 1. The digital signal processor 138 uses a design heuristic to infer instantaneous ambient noise, including fan (dB), instantaneous sounds of interest (signal, dB), and their signal-to-noise ratio (SNR). In this example, the SNR determiner 204 provides means for calculating or providing a signal-to-noise ratio.

The relationship between sound and noise levels is generally described in terms of a signal-to-noise ratio. For example, signal-to-noise ratio as used herein is defined as the ratio of a power of a signal (meaningful input) to a power of background noise (meaningless or unwanted input) (e.g., a ratio of signal power to noise power). Thus, the SNR determiner 204 of the illustrated example separates sounds of interest (e.g., signals) from background noise (e.g., fan noise). For example, the SNR determiner 204 determines a signal-to-noise ratio by comparing a sound power level of a desired signal (e.g., a signal of interest) to a sound power level of background noise. For example, the SNR determiner 204 of the illustrated example determines the signal-to-noise ratio (e.g., a SNR calculation) by observing a captured sound waveform from signal data provided by the ambient noise monitor 202. For example, the SNR determiner 204 analyzes one or more amplitudes (e.g., spikes) of one or more frequencies associated with one or more sounds of interest and analyzes one or more amplitudes (e.g., spikes) of one or more frequencies associated with one or more background noises. In other words, the SNR determiner 204 of the illustrated example calculates a ratio between the one or more amplitudes associated with the identified sounds of interest (e.g., power level(s), decibel level(s), etc.) and one or more amplitudes associated with the identified background noise (e.g., power level(s), decibel level(s), etc.).

Because the signal data from the microphone 118 and/or the ambient noise monitor 202 may have a very wide dynamic range, the signal-to-noise ratio (e.g., signal/noise values) can be expressed using a logarithmic decibel scale. Thus, a signal-to-noise ratio as used herein can be representative of a ratio of signal power level to the noise power level that can be expressed in decibels. In some examples, sound intensity can be expressed on a decibel (dB) SPL (sound power level) logarithmic scale. On this scale, for example, Zero (0) dB SPL is a sound wave power of $10^{-16}$ watts/cm2, about the weakest sound detectable by a human ear. Normal speech is approximately 60 dB SPL. In some examples, the signal-to-noise ratio can be represented in absolute values. For example, a ratio of 1 to 1 (0 dB, or less than 1:1) indicates more noise than signal. In contrast, a ratio of greater than 1 to 1 (e.g., greater than 0 dB) (e.g., 2 tol; 4 to 1) can indicate more signal than noise.

To separate the sounds of interest from the background noise, the SNR determiner 204 of the illustrated example employs a combination of different heuristics. In the illustrated example, the SNR determiner 204 employs the filter 222, the AI inference engine 224 and the NLP 226. In some examples, the electronic device 100 can include only the filter 222, the AI inference engine 224 or the NLP 226, or any two combinations of the filter 222, the AI inference engine 224 or the NLP and/or any other technology to determine a signal-to-noise ratio of ambient sounds of an environment in which the electronic device 100 is located during use.

The filter 222 of the illustrated example employs frequency filtering techniques to classify and/or identify sounds of interest and background noise. In this example, the filter 222 provides means for filtering sound waves having different frequencies. For example, the filter 222 can be a frequency filter configured to filter and/or identify human-audible frequencies provided in the signal data from the ambient noise monitor 202. For example, the frequency filter can be configured to detect human-audible frequencies or other frequencies within a specified frequency range. For example, a human frequency range can include frequencies between 20 hertz (Hz) and 2 kilohertz (kHz). In some examples, the filter 222 can be configured to detect only certain frequencies between 20 Hz and 2 Khz and/or any other desired frequency range. For example, to detect human voice in the signal data provided by the ambient noise monitor 202, the filter 222 can include a band-pass filter to band pass a 20 Hz to 2 Khz range frequency and assign a root-mean-square (RMS) amplitude (e.g., provided in decibel units (dBA) or (dBm)) to quantify a sound of interest or a power level (e.g., a logarithmic measure) of the sound of interest. In some examples, design characteristics of the fan 132 typically provide fan acoustic characteristics 232 that include, for example, revolutions per minute (RPM(s)) versus nominal frequency (noise) that the fan 132 outputs at different speeds. For example, the acoustic characteristics 232 of the fan 132 can be stored in the database 218 as, for example, a look-up table. For example, the SNR determiner 204 can retrieve, obtain and/or otherwise receive the fan acoustic characteristics 232 from the database 218. In some such examples, the filter 222 can be include a band-pass filter to band pass the nominal fan frequency and assign a root-mean-square (RMS) amplitude (e.g., provided in decibel units (dBA) or (dBm)) to quantify noise or a power level (e.g., a logarithmic measure) of identified background noise. Conversely, a corresponding band-gap filter may be applied with a similar RMS/dBa/dBm calculation to estimate the noise. Thus, the filter 222 of the illustrated example can be a band-pass filter, a band-gap filter and/or any other filter to separate sounds of interest from background noise.

The AI inference engine 224 of the illustrated example employs an artificial intelligence and/or machine learning (AI/ML) model that can supplement the filter 222 (e.g., a band-RMS calculation). In this example, the AI inference engine 224 provides means for identifying and/or classifying different types of sounds captured by the microphone 118. For example, the SNR determiner 204 (e.g., implemented by the DSP 138) relays waveform patterns to the AI inference engine 224. The AI inference engine 224 can be trained to recognize interesting sounds (e.g., sounds of interest). That is, the AI/ML model can be trained (e.g., similar to image recognition) to identify signals such as indeterminate voice, music, dog barking, movie audio, etc. The affirmative identification of interesting artifacts is temporally correlated with underlying power (dBa/dBm) of the associated waveform and used to supply and/or modify a system signal-to-noise ratio. The AI inference engine 224 of the illustrated example can provide exclusions of sounds of interest (e.g., to supplement the filter 222). For example, a dog barking sound can be classified as a sound of interest by the filter 222 (e.g., given that the frequency of a dog's bark is within the auditory frequency range of human hearing). In contrast, the AI inference engine 224 (e.g., after being trained) can identify the dog's bark from the signal data (e.g., a sound waveform) and exclude the signal associated with the dog bark from the sounds of interest. Thus, the AI inference engine 206 can improve an accuracy of the filter 222 and/or the SNR determiner 204 when classifying signal data as sounds of interest and/or background noise.

The NLP 226 of the illustrated example can be implemented by a natural language processing algorithm and can also be used as a tool to supplement both the filter 222 and/or the AI inference engine 224. In some examples, the NLP 226 of the illustrated example includes a natural language processing model that can classify or identify sections of the signal data (i.e., sections of a sound waveform) associated with human voice communication (e.g., that can be directed at a user operating the electronic device 100). For example, the NLP 226 may be configured (e.g., trained) to exclude background television audio (e.g., audio signals) from a signal (e.g., sounds of interest) because the NLP model of the NLP 226 can be configured to identify or classify language as content from a television and, thus, determine that such language is likely not directed to a user of the electronic device 100. Thus, for example, a television voice waveform or sound power level can be excluded from the sound of interest identification and/or the SNR calculation performed by the SNR determiner 204. Thus, the NLP 226 can filter additional soundwaves to improve accuracy between an amplitude of a sound of interest and an amplitude of background noise when calculating a signal-to-noise ratio. In this example, the NLP 226 provides means for identifying and/or classifying specific speech.

In some examples, the fan acoustic output determiner 214 can determine anticipated noise generation by the fan 132 when instructed to operate at a certain speed. In this example, the fan acoustic output determiner 214 provides means for identifying a frequency output of the fan 132 when the fan 132 operates at a specific fan speed. This information can be provided to the thermal constraint determiner 208 and/or the SNR determiner 204 when determining if the signal-to-noise ratio would exceed the sensitivity threshold 228 based on an anticipated fan speed. For example, the fan acoustic output determiner 214 determines an acoustic or noise level (e.g., measured in dB) of the fan 132 when the fan operates a certain fan speed. For example, the fan acoustic output determiner 214 can retrieve, obtain and/or otherwise receive the fan acoustic characteristics 232 from the database 218 to determine a noise output value (e.g., measured in dB) for operating the fan a specific fan speed. In some examples, the thermal manager 136 can determine if the addition of the noise output by the fan would cause a violation of the signal-to-noise ratio and/or the thermal constraints provided by the thermal constraint determiner 208 prior to activating the fan 132. For example, the SNR determiner 204 can be configured to include the anticipated fan noise as background noise when determining the signal-to-noise ratio.

Based on the foregoing, the SNR determiner 204 (e.g., via the filter 222, the AI inference engine 224 and/or the NLP 226) can detect certain environments where excessive fan noise may be undesirable including, but not limited to, lectures, conversations, musical performances, quiet nights, conferences, meetings, birdwatching, etc. On the other hand, the SNR determiner 204 can detect environments where excessive fan noise may likely be unobtrusive and acceptable (e.g., the fan noise is not undesirable) including, but not limited to, for example, in/at public spaces, parties, expos, classrooms, a train station, an airport, etc.

To implement thermal constraints (e.g., an active cooling policy or passive cooling policy), the thermal manager 136 of the illustrated example includes the thermal constraint determiner 208. For example, after the SNR determiner 204 determines a signal-to-noise ratio based on the signal data from the ambient noise monitor 202, the thermal constraint determiner 208 compares (e.g., via a comparator) a signal-to-noise ratio determined by the SNR determiner 204 and the sensitivity threshold 228 stored via the database 218. For example, the thermal constraint determiner 208 of the illustrated example retrieves, obtains and/or otherwise receives the sensitivity threshold 228 to compare the signal-to-noise ratio value determined by the SNR determiner 204 to the sensitivity threshold 228. For example, the thermal constraint determiner 208 can impose thermal restrictions (e.g., favor passive cooling) in response to determining that a signal-to-noise ratio provided by the SNR determiner 204 exceeds the sensitivity threshold or the thermal constraint determiner 208 can remove thermal restrictions (e.g., favor active cooling and/or fan operation) in response to determining that a signal-to-noise ratio provided by the SNR determiner 204 does not exceed the sensitivity threshold.

To enable adjustment of the sensitivity threshold 228, the thermal manager 136 of the illustrated example includes the sensitivity threshold presenter 206. In this example, the sensitivity threshold presenter 206 provides means for presenting for user selection a sensitivity threshold for the signal-to-noise ratio. For example, the sensitivity threshold presenter 206 of the illustrated example enables a user to adjust a desired sensitivity of the electronic device 100 to ambient sound. For example, increasing a sensitivity may decrease a signal-to-noise ratio value needed to implement passive cooling and, in contrast, decreasing a sensitivity may increase a signal-to-noise ratio value needed to implement passive cooling. For example, the sensitivity threshold presenter 206 of the illustrated example enables a user of the electronic device 100 to adjust a sound of interest to background noise sensitivity. In other words, the sensitivity threshold presenter 206 of the illustrated example enables a user of the electronic device 100 to adjust the signal-to-noise ratio. In some examples, the sensitivity threshold presenter 206 can present for user selection one or more preferences during a setup process of the electronic device, at each instance that the thermal manager 136 seeks to impose thermal restrictions, periodically, and/or any other desired time.

The sensitivity threshold presenter 206 can be configured to provide options for a user of the electronic device 100 to enable a user to customize thermal policy constraints (e.g., rules or behavior) of the thermal manager 136. To enable a user to adjust the sensitivity threshold 228 (e.g., to allow a user to adjust the sensitivity of the electronic devices 100 to ambient sound), the sensitivity threshold presenter 206 of the illustrated example employs a user interface (UI). For example, the sensitivity threshold presenter 206 of the illustrated example employs the graphic user interface 120 of FIG. 1 to present adjustment of the sensitivity threshold 228. In some examples, example user interface (UI) systems disclosed herein can be present in an operating system (OS) of the electronic device 100.

In some examples, the sensitivity threshold presenter 206 can be configured to present a sound level slider (e.g., similar to a volume slider), or other similar control(s) and/or other setting control(s). In some examples, the sensitivity threshold presenter 206 can be configured to present a user interface that enables selection between one of the following settings: (a) a quiet setting; (2) a moderate setting; or (3) a loud setting. In some examples, the sensitivity threshold presenter 206 can be configured to present information to inform a user that favoring a quieter option can potentially reduce computer performance (e.g., by favoring passive cooling policies over active cooling policies). In some examples, the sensitivity threshold presenter 206 enables a user to specify (e.g., via a slider or selection menu) a minimum ratio of environmental sound (e.g., sounds of interest, measured in dB) to ambient and/or cooling sound power (e.g., measured in dB). In some examples, the sensitivity threshold presenter 206 of the illustrated example can be configured to present a master signal-to-noise ratio sensitivity threshold selector that presents for selection a menu item (e.g., a numeric, radio button, or dropdown menu), where each selection includes descriptive text associated with the selectable menu item. In some examples, the descriptive text can be presented as a question. For example, the sensitivity threshold presenter 206 can be configured to present to a user a question to specify "how sensitive to surrounding conversation/music/other meaningful sounds should the fan 132 of the electronic device 100 be?" and enable one of the following answers for selection via a selectable menu item: "very sensitive," "somewhat sensitive," "not sensitive" or "insensitive," "ignore" and/or any other selectable feature. In some examples, the sensitivity threshold presenter 206 can be configured to enable a user to modify how sounds of interest are determined. For example, when the signal-to-noise determiner 204 employs the AI inference engine 224, the sensitivity threshold presenter 206 can enable a user to select how the SNR determiner 204 detects sounds of interest and/or specify controls/constraints for the thermal manager 136 to "reduce fan speed when a nearby conversation is detected," "reduce fan speed when music is playing/detected," "reduce fan speed when other novel environmental sounds are detected," etc. Also, if the NLP 226 is in use, the sensitivity threshold presenter 206 can enable a user to specify controls/constraints for the thermal manager 136 to "only reduce fan speed for conversations I'm involved in," "ignore audio detected from TVs, radios, and other nearby device," etc. In some examples, to control noise, the sensitivity threshold presenter 206 of the illustrated example can be configured to enable a user to customize how noise is detected and managed by selecting items such as: "allow fans to be completely disabled," "specify minimum fan speed/noise for quiet environments," etc. As a secondary effect, the sensitivity threshold presenter 206 of the illustrated example can be configured to present a user interface (UI) for enhancing active/passive Dynamic Tuning Technology (DTT) policies to include items for user selection that include, for example, "limit device skin/enclosure temperature to X degrees." Although this selection may not directly influence how a signal-to-noise ratio is calculated, such limitation can place a limit to a degree the signal-to-noise ratio may influence noise by reducing fan speed. A user may also specify if certain components are powered off (as part of policy).

To determine the temperature of one or more hardware component(s) of the electronic device 100, the thermal manager 136 includes the temperature analyzer 210. For example, the temperature analyzer 210 of the illustrated example receives output data (e.g., signals) from the temperature sensor(s) 134 of FIG. 1. In this example, the temperature analyzer 210 provides means for analyzing the sensor data generated by the temperature sensor(s) 134. For example, the temperature analyzer 236 can detect an amount of heat generated by the processor 124 and/or a temperature of the exterior skin of the housing 102/104 during operation of the electronic device 100. For example, the temperature analyzer 210 of the illustrated example is configured to compare (e.g., via a comparator) if a temperature of one or more hardware components 122 exceeds an operating temperature threshold. For example, the temperature analyzer 210 can retrieve, obtain and/or otherwise receive operating temperature threshold from the database 218.

The example thermal manager 136 of FIG. 2 includes the fan speed manager 212. The fan speed manager 212 generates instruction(s) to control the fan speed (e.g., revolutions per minute) of the fan 132 of the electronic device 100 of FIG. 1 in response to instructions from the temperature analyzer 210, the thermal constraint determiner 208, and/or the fan acoustic output determiner 214. The fan speed manager 240 transmits the instruction(s) to the fan 132 via one or more wired or wireless connections.

The power source manager 216 generates instruction(s) that are transmitted to the power sources 126 of the electronic device 100 of FIG. 1 to control the power provided to the processor 124 and/or other hardware components 122 of the electronic device 100 (e.g., a video graphics card). As disclosed herein, increasing the power provided to one or more of the hardware components 122 of the electronic device 100 increases a performance level of those component(s) (e.g., the responsiveness, availability, reliability, recoverability, and/or throughput of the processor 124). In some examples, the thermal constraint determiner 208 communicates with the power source manager 216 to increase or decrease the power provided to the hardware component(s) of the electronic device 100 in view of thermal restrictions provided by the thermal constraint determiner 208 and/or the fan acoustic output determiner 214. The example power source manager 216 transmits the instruction(s) to the power source 126 via one or more wired or wireless connections.

In the illustrated example, the thermal manager 136 of the illustrated example adjusts or modifies thermal policy preferences (e.g., active cooling vs. passive cooling) based on a comparison between the signal-to-noise ratio and the sensitivity threshold 228, a fan noise level from the fan acoustic output determiner 214, and/or the temperature data provided by the temperature analyzer 210.

In operation, the thermal manager 136 monitors ambient noise conditions in the environment in which the electronic device 100 is located. In response to detected ambient noise conditions, the thermal manager 136 of the illustrated example enables the electronic device 100 to select between an active cooling policy, a reduced active cooling policy, or a passive cooling policy. For example, in response to thermal manager 136 detecting certain environmental conditions (e.g., the electronic device being brought into a quiet area), the electronic device 100 can favor a passive cooling policy over an active cooling policy. For example, the thermal manager 136 can restrict imposing active cooling noise beyond a certain ratio to any detected nearby audio signal of interest.

Additionally, the example thermal manager 136 of FIGS. 1 and/or 2 dynamically selects a thermal constraint to be assigned to the electronic device 100 based on analysis of the sensor data from the ambient noise monitor 202. For instance, the thermal manager 136 (e.g., the digital signal processor) of the illustrated example receives sensor data from the microphone 118 and/or the temperature analyzer 210 in substantially real-time (e.g., near the time the data is collected). Therefore, the thermal manager 136 of the illustrated example is configured to dynamically adjust thermal policy preferences based on detected ambient noise conditions and/or a temperature of one or more hardware components 122. For example, at first time, the thermal constraint determiner 208 can impose a first thermal policy for the electronic device 100 that corresponds to increased fan speed and, thus, fan noise. If, at a later time (e.g., 1 minute later, 5 minutes later, etc.), the thermal manager 136 detects that active cooling is needed, but the required fan speed would violate the sensitivity threshold 228 of the signal-to-noise ratio, the thermal manager 136 (e.g., via the thermal constraint determiner 208) can impose a second thermal policy for the electronic device 100 that reduces the fan speed and/or employs passive cooling instead of active cooling. In response, the power source manager 216 generates instructions to adjust the power provided to the hardware components 122 of the electronic device 100 to reduce heat generated and/or the fan speed manager 212 generate instructions to adjust the fan speed(s) (e.g., decrease the fan speed(s)) in view of the change in the thermal policy for the electronic device 100.

In some examples, the thermal manager 136 of the illustrated example can optionally employ passive cooling and/or override active cooling preferences in certain circumstances. For example, during a meeting in a conference room at which the electronic device 100 is actively cooling and the fan 132 is generating noise (e.g., is cooling loudly), the generated fan noise can be distracting and unnecessary (e.g., which can be caused by a temperature increase of the hardware components 122 due to an operating system installation update). The thermal manager 136 can determine that the electronic device 100 would be negligibly impacted by a passive thermal policy (e.g., cooling via throttling) and, thus, implements passive cooling and prevents operating the fan 132.

While an example manner of implementing the thermal manager 136 of FIG. 1 is illustrated in FIG. 2, one or more of the elements, processes and/or devices illustrated in FIG. 2 may be combined, divided, re-arranged, omitted, eliminated and/or implemented in any other way. Further, the example ambient noise monitor 202, the signal-to-noise ratio (SNR) determiner 204, the example sensitivity threshold presenter 206, the example thermal constraint determiner 208, the example temperature analyzer 210, the example fan speed manager 212, the example fan acoustic output determiner 214, the power source manager 216, the example database 218, the example filter 222, the example artificial intelligence (AI) interference engine 224, the natural language processor (NLP) 226, the sensitivity threshold value 228, the example fan acoustic characteristics 230 and/or, more generally, the example thermal manager 136 of FIGS. 1 and 2 may be implemented by hardware, software, firmware and/or any combination of hardware, software and/or firmware. Thus, for example, any of the example ambient noise monitor 202, the signal-to-noise ratio (SNR) determiner 204, the example sensitivity threshold presenter 206, the example thermal constraint determiner 208, the example temperature analyzer 210, the example fan speed manager 212, the example fan acoustic output determiner 214, the power source manager 216, the example database 218, the example filter 222, the example artificial intelligence (AI) interference engine 224, the natural language processor (NLP) 226, the sensitivity threshold value 228, the example fan acoustic characteristics 230 and/or, more generally, the example thermal manager 136 of FIGS. 1 and 2 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example ambient noise monitor 202, the signal-to-noise ratio (SNR) determiner 204, the example sensitivity threshold presenter 206, the example thermal constraint determiner 208, the example temperature analyzer 210, the example fan speed manager 212, the example fan acoustic output determiner 214, the power source manager 216, the example database 218, the example filter 222, the example artificial intelligence (AI) interference engine 224, the natural language processor (NLP) 226, the sensitivity threshold value 228, the example fan acoustic characteristics 230 is/are hereby expressly defined to include a non-transitory computer readable storage device or storage disk such as a memory, a digital versatile disk (DVD), a compact disk (CD), a Blu-ray disk, etc. including the software and/or firmware. Further still, the example thermal manager 136 of FIGS. 1 and 2 may include one or more elements, processes and/or devices in addition to, or instead of, those illustrated in FIG. 2, and/or may include more than one of any or all of the illustrated elements, processes, and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 3:
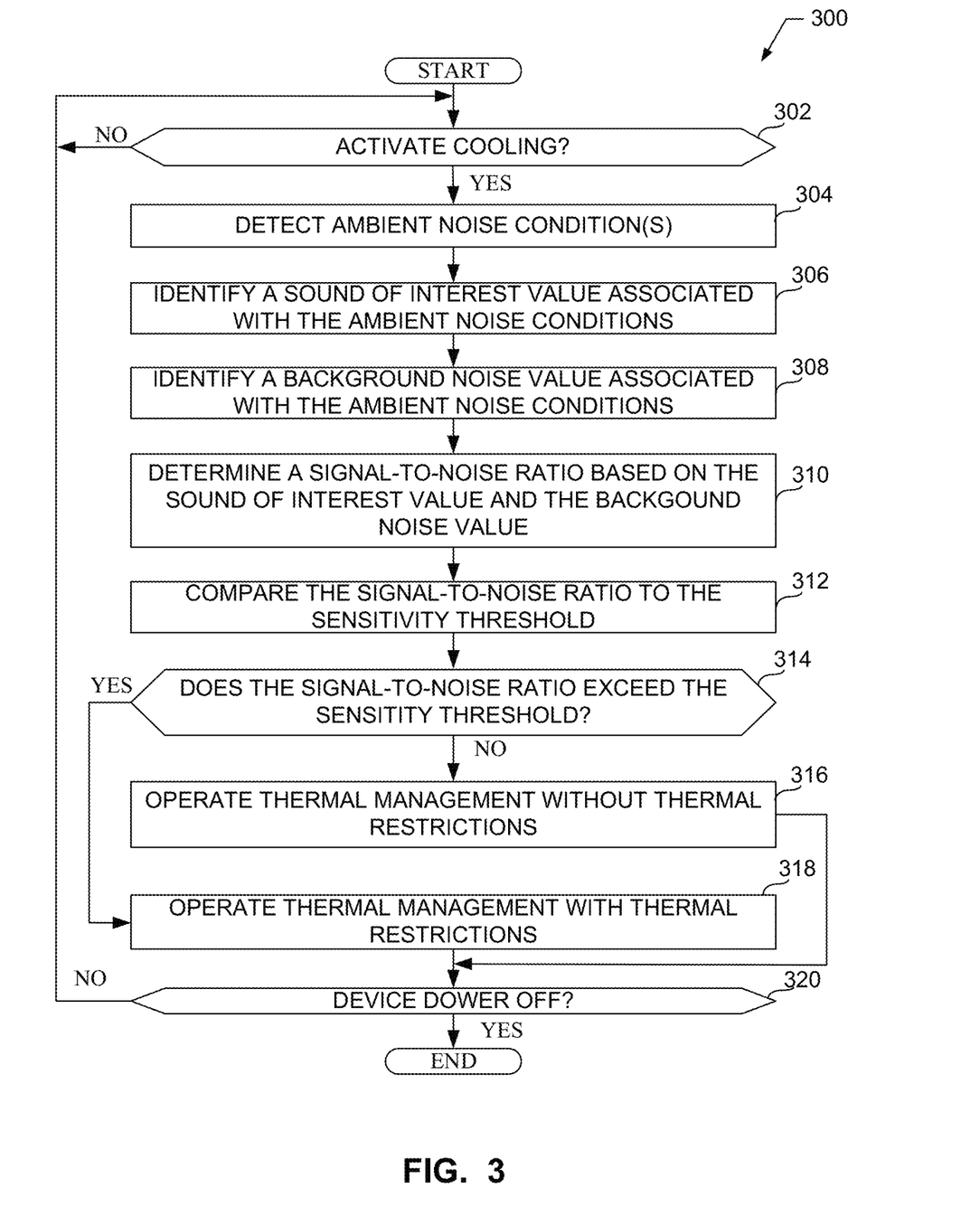
FIG. 3 is a flowchart representative of machine readable instructions which may be executed to implement the example thermal manager of FIG. 2.

A flowchart representative of example hardware logic, machine readable instructions, hardware implemented state machines, and/or any combination thereof for implementing the thermal manager 136 of FIG. 2 is shown in FIG. 3. The machine readable instructions may be one or more executable programs or portion(s) of an executable program for execution by a computer processor and/or processor circuitry, such as the processor 412 shown in the example processor platform 400 discussed below in connection with FIG. 4. The program may be embodied in software stored on a non-transitory computer readable storage medium such as a CD-ROM, a floppy disk, a hard drive, a DVD, a Blu-ray disk, or a memory associated with the processor 412, but the entire program and/or parts thereof could alternatively be executed by a device other than the processor 412 and/or embodied in firmware or dedicated hardware. Further, although the example program is described with reference to the flowchart illustrated in FIG. 3, many other methods of implementing the example thermal manager 136 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more devices (e.g., a multi-core processor in a single machine, multiple processors distributed across a server rack, etc.).

The machine readable instructions described herein may be stored in one or more of a compressed format, an encrypted format, a fragmented format, a compiled format, an executable format, a packaged format, etc. Machine readable instructions as described herein may be stored as data or a data structure (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement one or more functions that may together form a program such as that described herein.

In another example, the machine readable instructions may be stored in a state in which they may be read by processor circuitry, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable media, as used herein, may include machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example process of FIG. 3 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

In the example instruction of FIG. 3, the electronic device 100 can be in a working power state (e.g., a power state in which the device is fully operational in that the display 112 is turned on, applications are being executed by the processor(s) of the electronic device 100) or a connected standby state (e.g., a low power standby state in which the device remains connected to the Internet such that processor(s) of the device can respond quickly to hardware and/or network events). In the example of FIG. 3, the thermal manager 136 generates instruction(s) to control the thermal constraint(s) and/or fan acoustic constraint(s) of a user device (e.g., the electronic device 100) based on ambient condition(s) for an environment in which the device is located.

The program 300 of FIG. 3 begins when the thermal manager 136 determines whether to activate cooling (block 302). For example, the temperature analyzer 210 determines whether one or more electronic components (e.g., the hardware components 122) require cooling based on temperature data provided by the temperature sensor(s) 134. If the temperature analyzer 210 determines not to activate cooling (e.g., cooling is not needed), control returns to block 302. In some examples, the fan speed manager 212 determines the fan speed needed to meet the thermal performance based on the information from the temperature analyzer 210. In some examples, the fan acoustic output determiner 214 determines or measures an anticipated fan noise power level (e.g., measured in dB) for the determined fan speed determined by the fan speed manager 212 by retrieving and/or analyzing the fan acoustic characteristics 232. In some examples, the fan acoustic output determiner 214 provides this anticipated background noise generation of the fan 132 operating at a specific fan speed to the SNR determiner 204.

If at block 302 the thermal manager 136 determines to activate cooling, the thermal manager 136 detects ambient noise conditions (block 304). For example, the ambient noise monitor 202 receives signal data from one or more input devices (e.g., the microphone 118 and/or the external microphone 140). In some examples, the ambient noise monitor 202 can pre-process the data signal to improve signal quality and/or accuracy prior to communicating the data signal to the SNR determiner 204.

The thermal manager 136 identifies a sound of interest value associated with the ambient noise conditions (block 306) and identifies a background noise value associated with the ambient noise conditions (block 308). For example, the SNR determiner 204 identifies a sound of interest by evaluating an amplitude (dBA) of a sound of interest frequency range provided by the data signal from the ambient noise monitor 202. For example, the SNR determiner 204 identifies a background noise associated with the ambient noise conditions by measuring an amplitude (dBA) of a background noise frequency range (e.g., a frequency range outside of a frequency range of the sound of interest) of the signal data provided by the ambient noise monitor 202. In some examples, the filter 222 filters the signal data of the ambient noise monitor 202 to extract or identify frequencies associate with sounds of interest and filters the signal data of the ambient noise monitor 202 to extract or identify frequencies associate with background noise. In some examples, the AI inference engine 224 classifies the sounds of interest from the filter 222 by further filtering the frequency ranges that are associate with sounds of interest (e.g., human speech, dog barks, etc.) into sounds of interest (e.g., human speech) for determining the signal-to-noise ratio and sounds of non-interest (e.g., dog barking, vehicle horn, etc.) for exclusion from the signal-to noise ratio and/or for inclusion (e.g., reclassification as) background noise for determining the signal-to-noise ratio. In some examples, the NLP 226 can further classify sounds of interest from the filter 222 and/or the AI inference engine 224 by identifying or distinguishing a sound of interest (e.g., human speech in a lecture, human speech in a conference, etc.) for use in the signal-to-noise ratio calculation or a sound of non-interest (e.g., human speech at a park, human speech at a convention center, human speech at a ballpark, etc.) for exclusion from the signal-to noise ratio and/or inclusion (e.g., reclassification) as background noise for determining the signal-to-noise ratio. In some examples, the fan acoustic output determiner 214 provides an anticipated background noise that would be generated by the fan 132 based on a forecast fan speed determined by the fan speed manager 212 needed to cool one or more hardware components 122 to meet thermal performance.

The SNR determiner 204 and/or the thermal manager 136 determine a signal-to-noise ratio based on the sound of interest value and the background noise value (block 310). The thermal manager 136 then compares the signal-to-noise ratio value to a sensitivity threshold 228 (block 312). In some examples, the sensitivity threshold presenter 206 can present for user selection a desired sensitivity threshold.

The thermal manager 136 and/or the thermal constraint determiner 208 determines if the signal-to-noise ratio exceeds the sensitivity threshold 228 (block 314). If at block 314 the thermal manager 136 determines that the signal-to-noise ratio provided by the SNR determiner 204 does not exceed the sensitivity threshold 228 (e.g., the ratio is a 1:1), the thermal manager 136 operates the thermal management without thermal restrictions (block 318). In such examples, if increased fan noise is unlikely to be detected in a noisy environment in which the electronic device 100 is located, an operation of the fan 132 can be optimized to increase cooling and, thus, performance of the electronic device 100. In other words, the fan speed manager 212 causes the fan 132 to rotate at fan speed(s) (e.g., increased fan speeds) determined by the fan speed manager 212 needed to cool the electronic device 100 irrespective of increased fan noise.

If the thermal constraint determiner 208 determines that the signal-to-noise ratio exceeds the sensitivity threshold 228 (e.g., a ratio of 2:1 or greater), the thermal manager 136 operates the thermal management with thermal restrictions (e.g., block 318). For example, the fan speed manager 212 causes the fan 132 to rotate at either decreased speed(s) or the power source manager 216 removes power to the fan 132 (e.g., to cause the fan to turn off) and, thus, decrease and/or eliminate fan noise. In such examples, the increased fan noise is likely to be detected in an environment in which the electronic device 100 is located and, thus, operation of the fan 132 can be decreased or turned-off in favor of passive cooling policies to reduce noise. The thermal manager 136 can reduce power and/or throttle power to the fan 132 and/or processor 124 to cool the hardware components 122.

Figure 4:
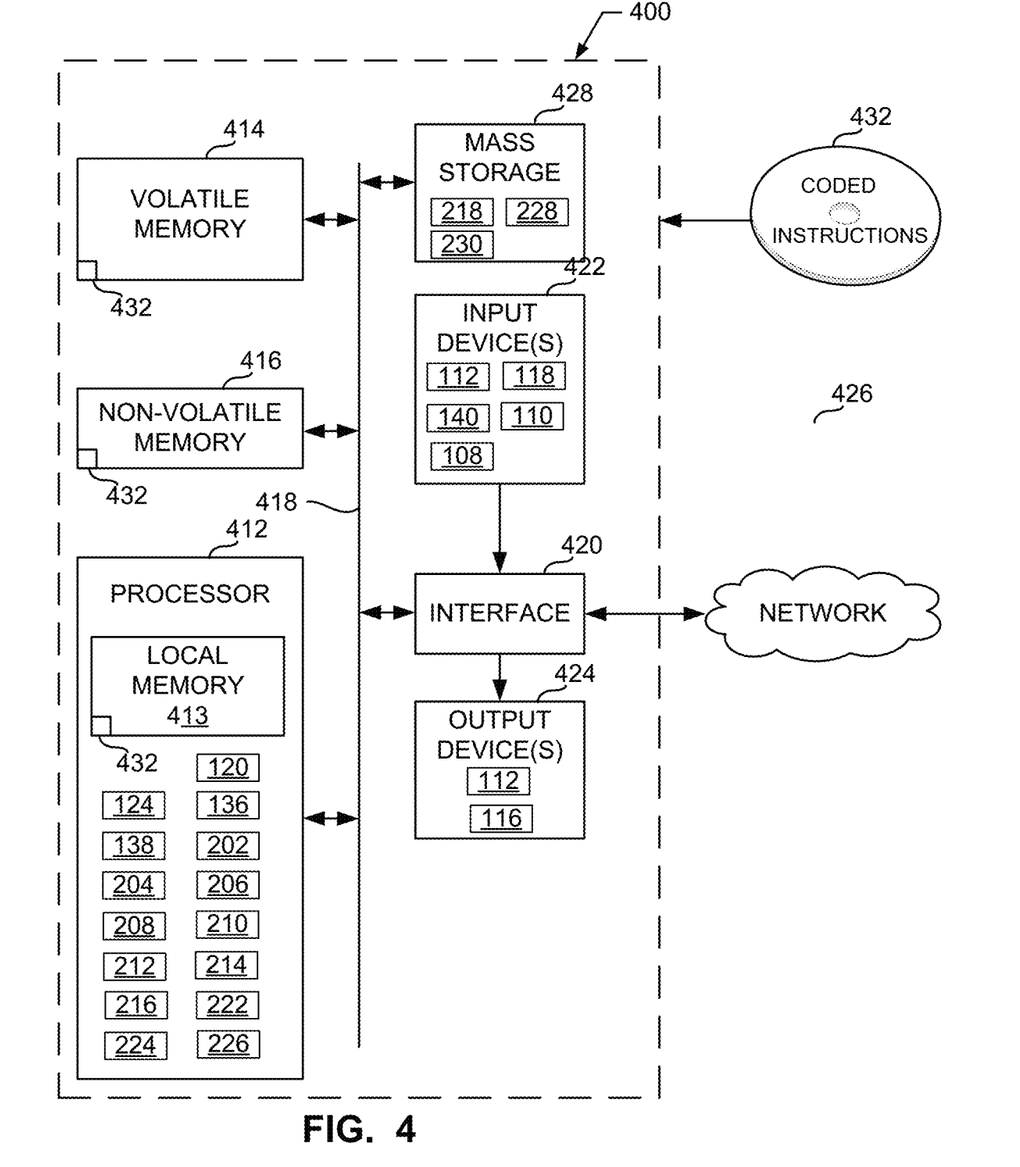
FIG. 4 is a block diagram of an example processing platform structured to execute the instructions of FIG. 3 to implement the example thermal manager of FIG. 1.

FIG. 4 is a block diagram of an example processor platform 400 structured to execute the instructions of FIG. 3 to implement the thermal manager 136 of FIGS. 1 and 2. The processor platform 400 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, or any other type of computing device.

The processor platform 400 of the illustrated example includes a processor 412. The processor 412 of the illustrated example is hardware. For example, the processor 412 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the example ambient noise monitor 202, the signal-to-noise ratio (SNR) determiner 204, the example sensitivity threshold presenter 206, the example thermal constraint determiner 208, the example temperature analyzer 210, the example fan speed manager 212, the example fan acoustic output determiner 214, the power source manager 216, the example filter 222, the example artificial intelligence (AI) interference engine 224, the natural language processor (NLP) 226, the thermal manager 136, the DSP 138, and/or the processor 124. After block 316 or block 318, the control proceeds to block 320. The instructions return to block 302 if the device is powered on (block 320) and the example instructions end when the electronic device is powered off (block 320).

The processor 412 of the illustrated example includes a local memory 413 (e.g., a cache). The processor 412 of the illustrated example is in communication with a main memory including a volatile memory 414 and a non-volatile memory 416 via a bus 418. The volatile memory 414 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 416 may be implemented by flash memory and/or any other desired type of memory device. Access to the main memory 414, 416 is controlled by a memory controller.

The processor platform 400 of the illustrated example also includes an interface circuit 420. The interface circuit 420 may be implemented by any type of interface standard, such as an Ethernet interface, a universal serial bus (USB), a Bluetooth® interface, a near field communication (NFC) interface, and/or a PCI express interface.

In the illustrated example, one or more input devices 422 are connected to the interface circuit 420. The input device(s) 422 permit(s) a user to enter data and/or commands into the processor 412. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 424 are also connected to the interface circuit 420 of the illustrated example. The output devices 424 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, and/or speaker. The interface circuit 420 of the illustrated example, thus, typically includes a graphics driver card, a graphics driver chip and/or a graphics driver processor.

The interface circuit 420 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 426. The communication can be via, for example, an Ethernet connection, a digital subscriber line (DSL) connection, a telephone line connection, a coaxial cable system, a satellite system, a line-of-site wireless system, a cellular telephone system, etc.

The processor platform 400 of the illustrated example also includes one or more mass storage devices 428 for storing software and/or data. Examples of such mass storage devices 428 include floppy disk drives, hard drive disks, compact disk drives, Blu-ray disk drives, redundant array of independent disks (RAID) systems, and digital versatile disk (DVD) drives.

The machine executable instructions 432 of FIG. 3 may be stored in the mass storage device 428, in the volatile memory 414, in the non-volatile memory 416, and/or on a removable non-transitory computer readable storage medium such as a CD or DVD.

Example methods, apparatus, systems, and articles of manufacture to analyze computer system attack mechanisms are disclosed herein. Further examples and combinations thereof include the following:

Example 1 includes an electronic device including a microphone and a thermal management system having a fan. The electronic device includes a processor to detect ambient noise via the microphone, identify a sound of interest value associated with the ambient noise and identify a background noise value associated with the ambient noise. The processor to determines a signal-to-noise ratio based on the sound of interest value and the background noise value and compares the signal-to-noise ratio to a sensitivity threshold. In response to determining that the signal-to-noise ratio exceeds the sensitivity threshold, the processor operates the thermal management system with one or more restrictions.

Example 2 includes the electronic device of example 1, where operating the thermal management system with the one or more restrictions includes at least one of reducing a speed of a fan or preventing operation of the fan.

Example 3 includes the electronic device of example 1, where the thermal management system is to adjust a power level for the processor of the electronic device in response to operating the thermal management system with the one or more restrictions.

Example 4 includes the electronic device of example 1, where the processor operates the thermal management system without restrictions in response to determining that the signal-to-noise ratio does not exceed the sensitivity threshold.

Example 5 includes the electronic device of example 1, further including a digital signal processor to calculate the signal-to-noise ratio.

Example 6 includes the electronic device of example 1, further including a band-pass filter to classify the detected ambient noise.

Example 7 includes the electronic device of example 1, further including at least one of an artificial intelligence inference engine or a natural language model to classify the detected ambient noise.

Example 8 includes the electronic device of example 1, further including a sensitivity threshold selector to present a plurality of sensitivity thresholds for user selection Example 9 includes at least one non-transitory computer readable storage medium comprising instructions that, when executed, cause a machine to at least: detect ambient noise; identify a sound of interest value associated with the ambient noise and a background noise value associated with the ambient noise; determine a signal-to-noise ratio based on the sound of interest value and the background noise value; compare the signal-to-noise ratio to a sensitivity threshold; and in response to determining that the signal-to-noise ratio exceeds the sensitivity threshold, operate a thermal management system of an electronic device with one or more restrictions.

Example 10 includes the at least one non-transitory computer readable storage medium of claim 9, where the instructions, when executed, further cause the machine to at least one of: (1) reduce a speed of a fan or (2) prevent operation of the fan to operate the thermal management system with the one or more restrictions.

Example 11 includes the at least one non-transitory computer readable storage medium of claim 9, where the instructions, when executed, further cause the machine to adjust a power level for a processor of an electronic device in response to determining that the signal-to-noise ratio exceeds the sensitivity threshold.

Example 12 includes the at least one non-transitory computer readable storage medium of claim 9, where the instructions, when executed, further cause the machine to operate the thermal management system without restrictions in response to determining that the signal-to-noise ratio does not exceed the sensitivity threshold.

Example 13 includes the at least one non-transitory computer readable storage medium of claim 9, wherein the instructions, when executed, further cause the machine to extract the sound of interest value and the background noise value from the detected ambient noise via a filter.

Example 14 includes the at least one non-transitory computer readable storage medium of claim 9, where the instructions, when executed, further cause the machine to present a plurality of sensitivity thresholds for user selection.

Example 15 includes a method including detecting ambient noise; identifying a sound of interest value associated with the ambient noise and a background noise value associated with the ambient noise; determining a signal-to-noise ratio based on the sound of interest value and the background noise value; comparing the signal-to-noise ratio to a sensitivity threshold; and in response to determining that the signal-to-noise ratio exceeds the sensitivity threshold, operating a thermal management system with one or more restrictions.

Example 16 includes the method as defined in claim 15, further including at least one of: (1) reducing fan speed or (2) preventing fan operation to operate the thermal management system with the one or more restrictions.

Example 17 includes the method as defined in claim 15, further including adjusting a power level for a processor of an electronic device in response to determining that the signal-to-noise ratio exceeds the sensitivity threshold.

Example 18 includes the method as defined in claim 15, further including operating the thermal management system without restrictions in response to determining that the signal-to-noise ratio does not exceed the sensitivity threshold.

Example 19 includes the method as defined in claim 15, further including passing the ambient noise through a filter to identify the sound of interest value and the background noise value.

Example 20 includes method as defined in claim 15, further including presenting a plurality of sensitivity thresholds for user selection.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

The following claims are hereby incorporated into this Detailed Description by this reference, with each claim standing on its own as a separate embodiment of the present disclosure.

What is claimed is:

1. An electronic device comprising:
   a microphone;
   a thermal management system including a fan; and
   a processor to:
      detect ambient noise via the microphone;
      identify a sound of interest value associated with the ambient noise;
      identify a background noise value associated with the ambient noise;
      determine a signal-to-noise ratio based on the sound of interest value and the background noise value;
      compare the signal-to-noise ratio to a sensitivity threshold; and
      in response to determining that the signal-to-noise ratio exceeds the sensitivity threshold, operate the thermal management system with one or more restrictions.

2. The electronic device as defined in claim 1, wherein operating the thermal management system with the one or more restrictions includes at least one of reducing a speed of a fan or preventing operation of the fan.

3. The electronic device as defined in claim 1, wherein the thermal management system is to adjust a power level for the processor of the electronic device in response to operating the thermal management system with the one or more restrictions.

4. The electronic device as defined in claim 1, wherein the processor operates the thermal management system without restrictions in response to determining that the signal-to-noise ratio does not exceed the sensitivity threshold.

5. The electronic device as defined in claim 1, further including a digital signal processor to calculate the signal-to-noise ratio.

6. The electronic device as defined in claim 1, further including a band-pass filter to classify the detected ambient noise.

7. The electronic device as defined in claim 1, further including at least one of an artificial intelligence inference engine or a natural language model to classify the detected ambient noise.

8. The electronic device as defined in claim 1, further including a sensitivity threshold selector to present a plurality of sensitivity thresholds for user selection.

9. At least one non-transitory computer readable storage medium comprising instructions that, when executed, cause a machine to at least:
   detect ambient noise;
   identify a sound of interest value associated with the ambient noise and a background noise value associated with the ambient noise;
   determine a signal-to-noise ratio based on the sound of interest value and the background noise value;
   compare the signal-to-noise ratio to a sensitivity threshold; and
   in response to determining that the signal-to-noise ratio exceeds the sensitivity threshold, operate a thermal management system of an electronic device with one or more restrictions.

10. The at least one non-transitory computer readable storage medium of claim 9, wherein the instructions, when executed, further cause the machine to at least one of: (1) reduce a speed of a fan or (2) prevent operation of the fan to operate the thermal management system with the one or more restrictions.

11. The at least one non-transitory computer readable storage medium of claim 9, wherein the instructions, when executed, further cause the machine to adjust a power level for a processor of an electronic device in response to determining that the signal-to-noise ratio exceeds the sensitivity threshold.

12. The at least one non-transitory computer readable storage medium of claim 9, wherein the instructions, when executed, further cause the machine to operate the thermal management system without restrictions in response to determining that the signal-to-noise ratio does not exceed the sensitivity threshold.

13. The at least one non-transitory computer readable storage medium of claim 9, wherein the instructions, when executed, further cause the machine to extract the sound of interest value and the background noise value from the detected ambient noise via a filter.

14. The at least one non-transitory computer readable storage medium of claim 9, wherein the instructions, when executed, further cause the machine to present a plurality of sensitivity thresholds for user selection.

15. A method comprising:
   detecting ambient noise;
   identifying a sound of interest value associated with the ambient noise and a background noise value associated with the ambient noise;
   determining a signal-to-noise ratio based on the sound of interest value and the background noise value;
   comparing the signal-to-noise ratio to a sensitivity threshold; and
   in response to determining that the signal-to-noise ratio exceeds the sensitivity threshold, operating a thermal management system with one or more restrictions.

16. The method as defined in claim 15, further including at least one of: (1) reducing fan speed or (2) preventing fan operation to operate the thermal management system with the one or more restrictions.

17. The method as defined in claim 15, further including adjusting a power level for a processor of an electronic device in response to determining that the signal-to-noise ratio exceeds the sensitivity threshold.

18. The method as defined in claim 15, further including operating the thermal management system without restrictions in response to determining that the signal-to-noise ratio does not exceed the sensitivity threshold.

19. The method as defined in claim 15, further including passing the ambient noise through a filter to identify the sound of interest value and the background noise value.

20. The method as defined in claim 15, further including presenting a plurality of sensitivity thresholds for user selection.

* * * * *